United States Patent [19]
Hashiguchi

[11] Patent Number: 5,157,328
[45] Date of Patent: Oct. 20, 1992

[54] SYSTEM FOR AND METHOD OF DETECTING REVERSE PACKAGING OF PROM

[75] Inventor: Ryoji Hashiguchi, Tokyo, Japan

[73] Assignee: Ando Electric Co., Ltd., Tokyo, Japan

[21] Appl. No.: 646,097

[22] Filed: Jan. 25, 1991

[30] Foreign Application Priority Data

Feb. 6, 1990 [JP] Japan .................... 2-26422

[51] Int. Cl.⁵ ...................... G01R 31/02; G01R 31/28
[52] U.S. Cl. ................................ 324/158 R; 324/73.1;
    371/22.6; 371/21.2; 365/201; 340/653
[58] Field of Search ............ 324/158 R, 73.1, 158 D,
    324/158 T; 365/201; 371/20, 22.6, 21.1, 25.1;
    340/653, 656

[56] References Cited

U.S. PATENT DOCUMENTS

| | | | |
|---|---|---|---|
| 3,356,945 | 12/1967 | Ryan et al. | 324/158 T |
| 3,676,767 | 7/1972 | Boelter | 324/158 D |
| 4,245,331 | 1/1981 | Hamano et al. | 340/656 |
| 4,727,317 | 2/1988 | Oliver | 324/158 R |
| 4,864,219 | 9/1989 | Parsons | 371/22.6 |

Primary Examiner—Vinh Nguyen
Attorney, Agent, or Firm—Flynn, Thiel, Boutell & Tanis

[57] ABSTRACT

There are disclosed a system for and a method of detecting a reverse packaging of a PROM capable of judging the packaging state of PROM having different impedances by adding an impedance switching circuit to the conventional socket. The method includes the steps of turning off the switch in the impedance switching circuit so that the socket receives a first voltage supplied from one of the impedances, storing the first voltage received by the socket, turning on the switch in the impedance switching circuit so that the socket receives a second voltage supplied from another impedance, storing the second voltage received by the socket, and judging that the PROM is normally packaged in the socket in case that the first voltage is equal to the second voltage and the PROM is reversely packaged in the socket in case that the first voltage is not equal to the second voltage.

9 Claims, 3 Drawing Sheets

SYSTEM FOR AND METHOD OF DETECTING REVERSE PACKAGING OF PROM

BACKGROUND OF THE INVENTION

1. Field of the Invention

The present invention relates to a system for and a method of detecting electrically reverse packaging of a PROM when the PROM is packaged on a socket.

2. Prior Art

A conventional method of and apparatus for detecting reverse packaging of a programmable read-only memory (hereinafter referred to as PROM) will be described with reference to FIG. 4.

Desginated at 2 is a socket, 6 is a detecting circuit and 7 is judging means.

The PROM is packged on the socket 2. In FIG. 4, the detecting circuit 6 is connected to a terminal 2D of the socket 2.

The relation between the socket 2 and the detecting circuit 6 will be described with reference to FIG. 5.

Designated at 5 is a PROM having an impedance 5F interposed between pins 5C and 5D. In FIG. 5, a parasitic diode is illustrated as the impedance 5F. The pin 5C of the PROM 5 is inserted into a ground terminal 2C of the socket 2 and the pin 5D of the PROM 5 is inserted into terminal 2D of the socket 2. The detecting circuit 6 is connected to the terminal 2D of the socket 2. A reference voltage is applied to one of the input terminals of a comparator 6A of the detecting circuit 6 and an output voltage of the socket 2 supplied from the terminal 2D and $-5$ V are applied to another input terminal 6C of the detecting circuit 6. The resultant comparison value is supplied from the output of the comparator 6A to the judging means 7.

The circuit as illustrated in FIG. 5 is illustrated in FIG. 2 of the Japanese Utility Model Application No. 63-36998.

The step of judging the packaging state of the PROM 5 by the judging means 7 is illustrated in the flow-chart of FIG. 6.

In Step 8, the judging means 7 judges as to whether the PROM 5 is packaged in the socket 2. If the reference voltage of the detecting circuit 6 to be applied to the input terminal 6B of the comparator 6A is 4 V and the output voltage of the socket 2 supplied from the terminal 2D is at least $-4$ V, it is judged that the PROM 5 is not packaged in the socket 2 and it is judged that the PROM 5 is packaged in other case.

In Step 9, the judging means 7 judges as to whether the PROM 5 is reversely packaged in the socket 2. If the reference voltage of the detecting circuit 6 to be applied to the input terminal 6B is $-1$ V and the output voltage of the socket 2 applied from the terminal 2D is at least $-1$ V, it is judged that the PROM 5 is reversely packaged in the socket 2 and it is judged that the PROM 5 is reversely packaged in other case.

However, there has been such a problem in the steps of judging as illustrated in FIG. 6 that it is not judged as to whether the PROM having different impedances is packaged or not packaged in the socket 2 since it has been judged whether the PROM 5 is packaged or not and whether the PROM 5 is normally packaged or reversely packaged with use of the two reference voltages, i.e. 4 V and $-1$ V.

SUMMARY OF THE INVENTION

It is an object of the present invention to provide a sytem for and a method of detecting a reverse packaging of a PROM capable of judging the packaging state of PROM having different impedances by adding an impedance switching circuit to the conventional socket.

To achieve the object of the present invention, a first aspect of the invention is to provide a sytem for detecting a reverse packaging of a PROM comprising an impedance switching circuit 1 composed of a switch 1A, a PROM having a first impedance 5D connected between a power supply pin 5A and a specific pin 5B and a second impedance 5E connected between the specific pin 5B and a ground pin 5C, a socket having a power supply terminal 2A to which an output of the impedance switching circuit 1 and the power supply pin 5A of the PROM 5 are connected and a ground terminal 2C connected to the ground pin 5C of the PROM 5, a detecting circuit 3 having an A/D converter 3A to which $-5$ V and an analog value of an output of the specific terminal 2B of the socket 2 are applied and which converts the analog value to a digital value, and a judging means 4 for receiving an output of the detecting circuit 3 and judging whether the PROM 5 is normally or reversely packaged in the socket 2.

A second aspect of the invention is to provide a method of detecting a reverse packaging of a PROM in a system comprising an impedance switching circuit 1 composed of a switch 1A, a PROM having a first impedance 5D connected between a power supply pin 5A and a specific pin 5B and a second impedance 5E connected between the specific pin 5B and a ground pin 5C, a socket having a power supply terminal 2A to which an output of the impedance switching circuit 1 and the power supply pin 5A of the PROM 5 are connected and a ground terminal 2C connected to the ground pin 5C of the PROM 5, a detecting circuit 3 having an A/D converter 3A to which $-5$ V and an analog value of an output of the specific terminal 2B of the socket 2 are applied and which converts the analog value to a digital value, and a judging means 4 for receiving an output of the detecting circuit 3 and judging that the PROM 5 is normally or reversely packaged in the socket 2, the method comprising the steps of turning off the switch 1A so that the specific terminal 2B of the socket 2 receives a voltage X supplied from the impedance 5E, storing voltage X received by the specific terminal 2B in a storage portion of the judging means 4, turning on the switch 1A so that the specific terminal 2B receives a voltage Y supplied from the impedance 5E, storing the voltage Y received by the specific terminal 2B in the storage portion of the judging means 4, and judging that the PROM 5 is normally packaged in the socket 2 in case of $X=Y$ and that the PROM 5 is reversely packaged in the socket 2 in case of $X \neq Y$.

The above and other objects, features and advantages of the present invention will become more apparent from the following description taken in conjunction with the accompanying drawings.

PREFERRED EMBODIMENT OF THE INVENTION

An arrangement for detecting the reverse packaging of a PROM according to the method of the present invention will be described with reference to FIG. 1.

Designated at 1 is an impedance switching circuit, 2 is a socket, 3 is a detecting circuit and 4 is a judging means.

Figure 1:
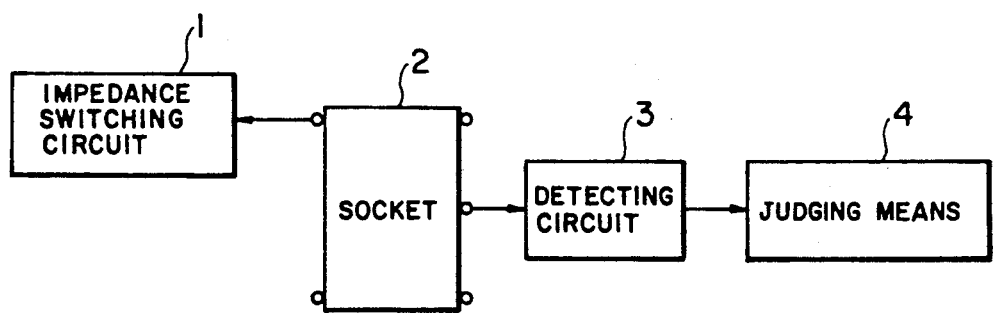
FIG. 1 is a view showing an arrangement for detecting the reverse packaging of PROM according to the method of the present invention.
Figure 4:
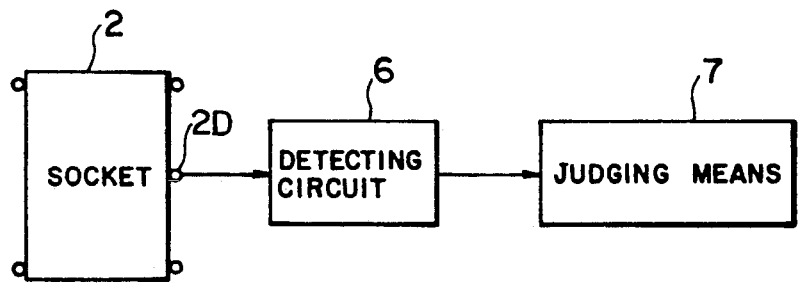
FIG. 4 is a view showing a prior art arrangement for detecting the reverse packaging of a PROM.
Figure 5:
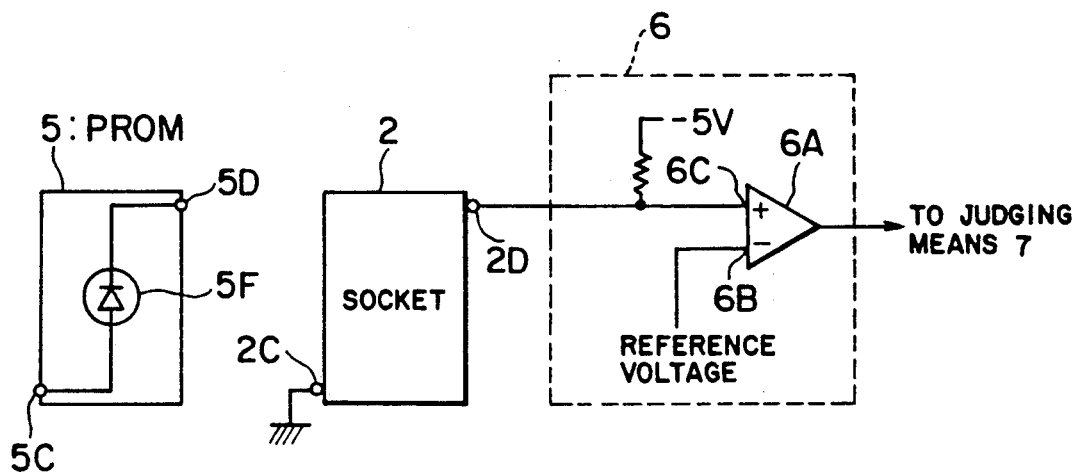
FIG. 5 is a circuit diagram of a socket and a detecting circuit, constituents of the arrangement of FIG. 4.
Figure 6:
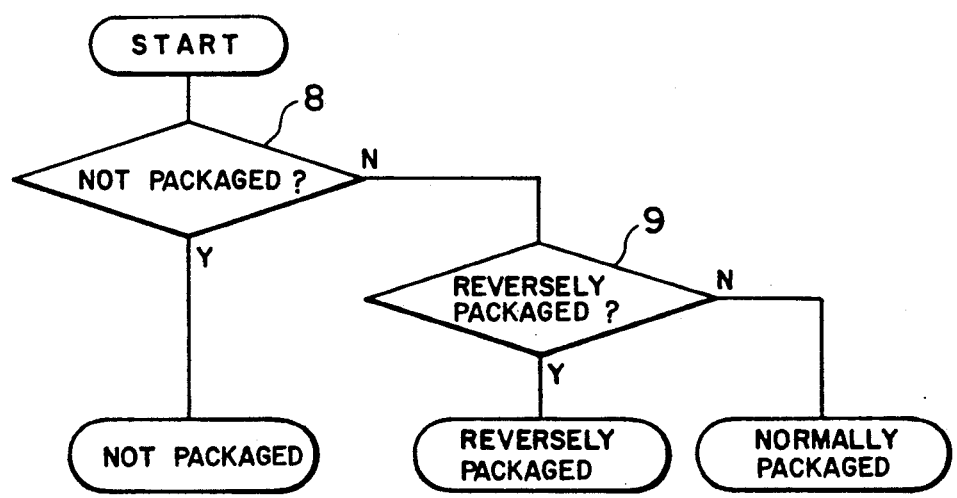
FIG. 6 is a flow-chart showing the steps of judging by the arrangement of FIG. 4.

FIG. 1 includes the impedance switching circuit 1 in addition to the conventional arrangement of FIG. 4.

The circuit diagram of the impedance switching circuit 1, the socket 2 and the detecting circuit 3 of FIG. 1 will be described with reference to FIG. 2.

Designated at 5 is a PROM which has an impedance 5D connected between a power supply pin 5A and a specific pin 5B and an impedance 5E connected between the specific pin 5B and a ground pin 5C. Parasitic diodes are respectively employed as the impedances 5D and 5E. An output of the impedance switching circuit 1 and the power supply pin 5A of the PROM 5 are respectively connected to a power supply terminal 2A of the socket 2, the specific pin 5B is connected to a specific terminal 2B of the socket 2 and the ground pin 5C is connected to a ground terminal 2C of the socket 2. Designated at 1A of the impedance switching circuit 1 is a switch.

The detecting circuit 3 has an input to which −5 V is applied and an A/D converter 3A which receives an analog value of voltage from the specific pin 2B of the socket 2 and converts the analog value of the voltage to a digital value. The resultant digital value of voltage is supplied to the judging means 4.

Figure 3:
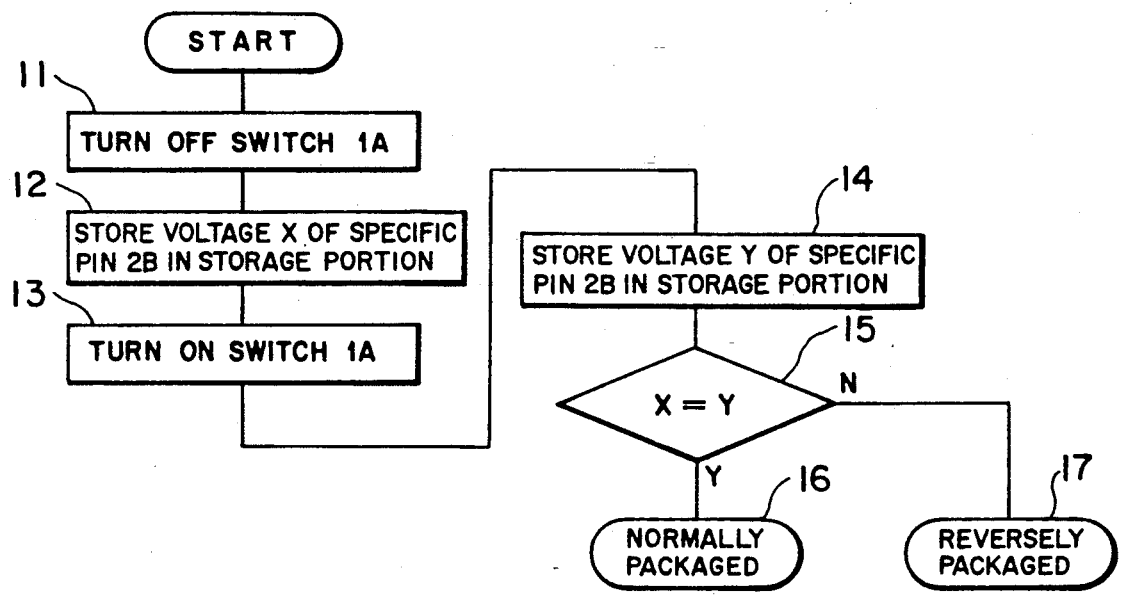
FIG. 3 is a flow-chart of assistance in explaining the steps of judging by the arrangement of FIG. 1.

The operation of the arrangement of FIG. 1 will be described with reference to the flow-chart of FIG. 3.

In Step 11, the switch 1A is turned off. Then, the specific terminal 2B of the socket 2 receives a voltage X supplied from the impedance 5E.

In Step 12, the judging means 4 stores the voltage X received by the specific terminal 2B in Step 11 in a storage portion thereof.

In Step 13, the switch 1A is turned on. Then, the specific terminal 2B receives a voltage Y supplied from the impedance 5E.

In Step 14, the judging means 4 stores the voltage Y received by the specific terminal 2B in Step 13 in the storage portion thereof.

In Step 15, the judging means 15 judges as to whether $X=Y$. Inasmuch as X and Y are values of the voltage of the same impedance 5E, it is judged that the PROM 5 is normally packaged in the socket 2.

A second case is when the PROM 5 is reversely packaged in the socket 2.

When the PROM 5 is reversely packaged in the socket 2, the pin 5G other than the specific pin 5B of the PROM 5 is connected to the specific pin 2B of the socket 2, the ground pin 5C is connected to the power supply terminal 2A and the power supply pin 5A is connected to the ground terminal 2C of the socket 2.

In Step 11, the switch is turned off. Then, the specific terminal 2B of the socket 2 receives a voltage X which is irrelevant to the impedances 5D and 5E.

In Step 12, the judging means 4 stores the voltage X thus received by the specific terminal 2B in Step 11 in the storage portion thereof.

In Step 13, the switch 1A is turned on. Then, the specific terminal 2B receives a voltage Y supplied from the impedance 5E.

In Step 14, the judging means 4 stores the voltage Y thus received by the specific terminal 2B in Step 13 in the storage portion thereof.

In Step 15, the judging means 4 judges as to whether $X=Y$. Inasmuch as the voltage X is irrelevant to the impedances 5D and 5E and the voltage Y is the voltage of the impedance 5E, an expression $X \neq Y$ is established, which is judged as the reverse packing.

With the arrangement of the system for and the method of detecting reverse packaging of the PROM according to the present invention, it is possible to judge the packaging of the PROM even if the PROM has different impedances therein since it is judged that the PROM is normally inserted into the socket provided that the expression $X=Y$ is established wherein X is an output voltage of the specific terminal of the socket in case that the switch of the impedance switching circuit is turned off and Y is an output voltage of the specific terminal of the socket and it is judged that the PROM is reversely inserted into the socket provided that the express $X \neq Y$ is established.

Figure 2:
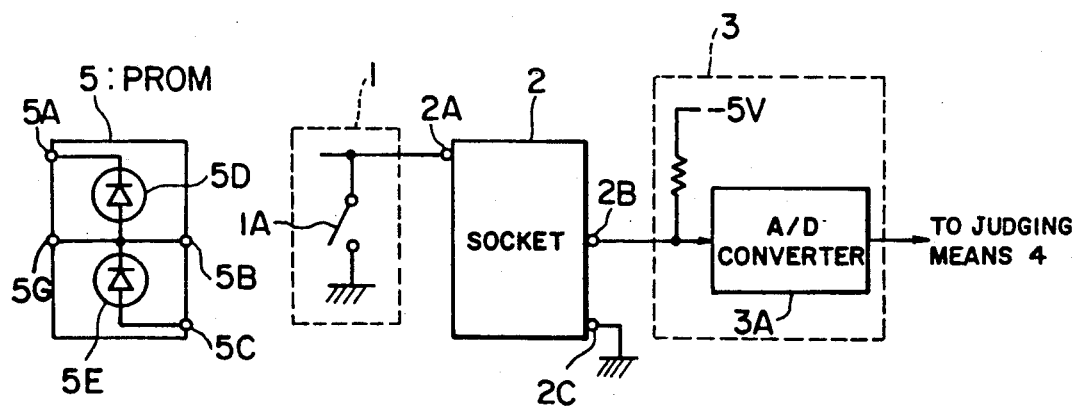
FIG. 2 is a circuit diagram showing an impedance switching circuit, a socket and a detecting circuit, constituents of the arrangement of FIG. 1.

As evident from FIG. 2 and above-described operation, the −5 V pull-up circuit is cooperable with the impedance switching circuit 1 and the PROM impedances 5D and 5E for permitting voltages X and Y to be sequentially applied to terminal 2B. The −5 V pull-up circuit operates to apply a reference voltage to terminal 2B while also permitting the voltage at terminal 2B to change.

Although the invention has been described in its preferred form with a certain degree of particularity, it is to be understood that many variations and changes are possible in the invention without departing from the scope thereof.

What is claimed is:

1. A system for detecting a reverse packaging of a PROM comprising:

an impedance switching circuit including an output terminal and a switch means for selectively connecting and disconnecting said output terminal to and from a node which is held at a predetermined electrical potential;

a PROM having a first impedance connected between a power supply pin and a specific pin, and a second impedance connected between the specific pin and a ground pin;

a socket having a power supply terminal to which said output terminal of the impedance switching circuit and the power supply pin of the PROM are connected, a specific terminal connected to the specific pin of the PROM, and a ground terminal connected to the ground pin of the PROM;

a detecting circuit having an A/D converter to which a reference voltage and an analog output of the specific terminal of the socket are applied and which converts the analog output to a digital value; and a judging means for receiving an output of the detecting circuit and judging whether the PROM is normally or reversely packaged in the socket.

2. A system according to claim 1, wherein said reference voltage is −5 volts.

3. A system according to claim 2, wherein said predetermined electrical potential is electrical ground.

4. An apparatus according to claim 1, wherein said predetermined electrical potential is electrical ground.

5. A method of detecting a reverse packaging of a PROM in a system comprising an impedance switching circuit composed of a switch, a PROM having a first impedance connected between a power supply pin and a specific pin and a second impedance connected between the specific pin and a ground pin, a socket having a power supply terminal to which an output of the impedance switching circuit and the power supply pin of the PROM are connected, a specific terminal connected to the specific pin of the PROM, and a ground terminal connected to the ground pin of the PROM, a detecting circuit having an A/D converter to which −5 V and an analog value of an output of the specific terminal of the socket are applied and which converts the analog value to a digital value, and a judging means for receiving an output of the detecting circuit and judging that the PROM is normally or reversely packaged in the socket, the method comprising the steps of:

turning off the switch so that the specific terminal of the socket receives a voltage X supplied from the second impedance;

storing a voltage X received by the specific terminal in a storage portion of the judging means;

turning on the switch so that the specific terminal receives a voltage Y supplied from the second impedance;

storing the voltage Y received by the specific terminal in the storage portion of the judging means; and judging that the PROM is normally packaged in the socket in case of $X=Y$ and the PROM is reversely packaged in the socket in case of $X \neq Y$.

6. A system for detecting reverse packaging of PROM having a power supply pin, a ground pin, a third pin, a first impedance connected between the power supply pin and the third pin, and a second impedance connected between the third pin and the ground pin, comprising:

a socket having a power supply terminal, a ground terminal and a third terminal which are respectively adapted for connection to the power supply pin, the ground pin and the third pin of the PROM when the PROM is properly packaged in said socket;

an impedance switching means for selectively connecting and disconnecting said power supply terminal of said socket to and from a node which is held at a predetermined electrical potential;

means cooperable with said impedance switching means and the PROM impedances for permitting generation of a sequence of voltage levels on said third terminal of said socket;

means for producing and storing information which represents said sequence of voltage levels; and means responsive to said stored information for determining whether the PROM is reversely packaged in said socket.

7. A system according to claim 6, wherein said means for producing and storing information includes an A/D converter.

8. A system according to claim 7, wherein said predetermined electrical potential is electrical ground.

9. A method of detecting reverse packaging of a PROM in a system comprising an impedance switching circuit, a PROM having a power supply pin, a ground pin, a third pin, a first impedance connected between the power supply pin and the third pin, and a second impedance connected between the third pin and the ground pin, a socket connected to the impedance switching circuit and having a power supply terminal, a ground terminal and a third terminal which are respectively adapted for connection to the power supply pin, the ground pin and the third pin of the PROM when the PROM is correctly packaged in the socket, and reference voltage means for applying a reference voltage to the third terminal of the socket, comprising the steps of:

activating the impedance switching circuit so that the third terminal of the socket has applied thereto a voltage which, if the PROM is correctly packaged in the socket, is supplied from the second impedance;

storing a voltage X which is actually applied to the third terminal of the socket in response to activation of the impedance switching circuit;

deactivating the impedance switching circuit so that the third terminal of the socket has applied thereto a voltage which, if the PROM is correctly packaged in the socket, is supplied from the second impedance;

storing a voltage Y which is actually applied to the third terminal of the socket in response to deactivation of the impedance switching circuit;

comparing stored voltages X and Y; and determining that the PROM is correctly packaged in the socket if $X=Y$, and determining that the PROM is reversely packaged in the socket if $X \neq Y$.

* * * * *